(12) United States Patent
Andou

(10) Patent No.: US 10,461,273 B2
(45) Date of Patent: Oct. 29, 2019

(54) DISPLAY DEVICE HAVING A STRUCTURE TO PREVENT DAMAGE TO A BENT PORTION OF A FLEXIBLE DISPLAY

(71) Applicant: Japan Display Inc., Minato-ku (JP)

(72) Inventor: Naohisa Andou, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 54 days.

(21) Appl. No.: 15/416,293

(22) Filed: Jan. 26, 2017

(65) Prior Publication Data

US 2017/0229673 A1  Aug. 10, 2017

(30) Foreign Application Priority Data

Feb. 10, 2016  (JP) .................................. 2016-023880

(51) Int. Cl.
  *H01L 51/52* (2006.01)
  *H01L 51/00* (2006.01)
  *H01L 27/32* (2006.01)

(52) U.S. Cl.
  CPC ...... *H01L 51/5237* (2013.01); *H01L 51/0097* (2013.01); *H01L 27/3244* (2013.01); *H01L 2251/5338* (2013.01); *Y02E 10/549* (2013.01)

(58) Field of Classification Search
  CPC ............... G02F 1/167; G02F 1/133377; G02F 1/133305; G02F 1/1339; G02F 1/13392;
  (Continued)

(56) References Cited

U.S. PATENT DOCUMENTS

2013/0050608 A1*  2/2013  Hu ..................... G02F 1/133305
                                                 349/58
2013/0120912 A1*  5/2013  Ladouceur .......... H04M 1/0268
                                                 361/679.01
(Continued)

FOREIGN PATENT DOCUMENTS

CN       104300089 A       1/2015
CN       105009188 A      10/2015
(Continued)

OTHER PUBLICATIONS

Korean Office Action dated Jun. 27, 2018 in Patent Application No. 10-2017-0016826 (with English translation), 8 pages.
(Continued)

*Primary Examiner* — Huyen L Ngo
(74) *Attorney, Agent, or Firm* — Oblon, McClelland, Maier & Neustadt, L.L.P.

(57) ABSTRACT

A flexible display includes a display region and a peripheral region. A first reinforcement film is located on the display region of the flexible display and a second reinforcement film is located on the peripheral region of the flexible display. A semiconductor circuit chip is located on the peripheral region and a flexible board is located on the peripheral region. A side end portion of the first reinforcement film is in contact with a first side end portion of the second reinforcement film and a second side end portion of the second reinforcement film is in contact with one side of the semiconductor circuit chip. A third side end portion of the second reinforcement film is in contact with another side of the semiconductor circuit chip and the second reinforcement film is continuously formed from the first side end portion to the second side end portion.

3 Claims, 6 Drawing Sheets

(58) Field of Classification Search
CPC ............ H01L 51/5237; H01L 51/0097; H01L 27/3244; H01L 2251/5338; Y02E 10/549
See application file for complete search history.

(56) References Cited

U.S. PATENT DOCUMENTS

| | | | |
|---|---|---|---|
| 2013/0140965 A1* | 6/2013 | Franklin | G06F 1/1626 312/223.1 |
| 2015/0378391 A1* | 12/2015 | Huitema | G06F 1/163 361/679.03 |
| 2016/0037625 A1* | 2/2016 | Huitema | H05K 1/028 361/749 |
| 2016/0044751 A1* | 2/2016 | Ikeda | H05B 33/02 362/227 |
| 2016/0190055 A1* | 6/2016 | Jinbo | H01L 27/3276 257/99 |

FOREIGN PATENT DOCUMENTS

| | | | | |
|---|---|---|---|---|
| JP | 2010-98645 | | 4/2010 | |
| JP | 2013-175549 | | 9/2013 | |
| JP | 2015-127801 A | | 7/2015 | |
| JP | 2015127801 A | * | 7/2015 | ......... H04N 5/23293 |
| KR | 10-1570869 B1 | | 11/2015 | |

OTHER PUBLICATIONS

Combined Office Action and Search Report dated Dec. 4, 2018 in Chinese Patent Application No. 201710073618.4, 19 pages (with English translation).
Office Action dated May 15, 2015 in Japanese Patent Application No. 2016-023880 (with partial English translation).

* cited by examiner

DISPLAY DEVICE HAVING A STRUCTURE TO PREVENT DAMAGE TO A BENT PORTION OF A FLEXIBLE DISPLAY

CROSS-REFERENCE TO RELATED APPLICATION

The present application claims priority from Japanese application JP2016-023880 filed on Feb. 10, 2016, the content of which is hereby incorporated by reference into this application.

BACKGROUND OF THE INVENTION

1. Field of the Invention

The present invention relates to a display device.

2. Description of the Related Art

In recent years, narrowing a so-called picture-frame region (narrower picture-frame) that is located at the peripheral edge of a display region where an image is displayed has been required in order to miniaturize a display device or to widen the display region. Wiring lines or circuits are provided in the picture-frame region. The requirement for the narrower picture-frame is demanding especially in a mobile device such as a smartphone. However, there is an impression that the ideas for the narrower picture-frame have been already run out, and thus the narrower picture-frame has to be dealt with by other methods.

Therefore, it has been studied to substantially achieve the narrower picture-frame by using a flexible display and folding the picture-frame region of the flexible display onto the back side. JP 2010-098645 A and JP 2013-175549 A disclose flexible displays in each of which a circuit layer and an organic electroluminescent layer are formed on a resin substrate having flexibility.

Since the disconnection or breakage of the wiring line or circuit occurs when the picture-frame region of the flexible display is folded to be excessively small, a spacer to regulate the folding within the allowable range is needed. Moreover, it is necessary to prevent the edge of the spacer from damaging to the flexible display.

SUMMARY OF THE INVENTION

It is an object of the invention to prevent damage to a bent portion of a flexible display.

A display device according to an aspect of the invention includes: a flexible display including a display region and a peripheral region arranged in a length direction, the flexible display being bent in the peripheral region around an axis extending in a width direction orthogonal to the length direction, the flexible display being provided with a light-emitting element layer in the display region; and a spacer disposed inside a bend of the flexible display and including both end portions on both sides in the width direction, the spacer including a guide surface regulating the bend, wherein the both end portions of the spacer project from the flexible display in the width direction. According to the aspect of the invention, since the both end portions of the spacer are not in contact with the flexible display, damage to the bent portion can be prevented.

A display device according to another aspect of the invention includes: a flexible display including a display region and a peripheral region arranged in a length direction, the flexible display being bent in the peripheral region around an axis extending in a width direction orthogonal to the length direction, the flexible display being provided with a light-emitting element layer in the display region; and a spacer disposed inside a bend of the flexible display and including both end portions on both sides in the width direction; and a gel intervening between the spacer and the flexible display, the gel being in contact with the flexible display to regulate the bend. According to the aspect of the invention, since the gel intervenes between the spacer and the flexible display, damage to the bent portion can be prevented.

A display device according to still another aspect of the invention includes: a flexible display including a display region and a peripheral region arranged in a length direction, the flexible display being bent in the peripheral region around an axis extending in a width direction orthogonal to the length direction, the flexible display being provided with a light-emitting element layer in the display region; and a spacer disposed inside a bend of the flexible display and including both end portions on both sides in the width direction, the spacer including a guide surface regulating the bend, wherein the both end portions of the spacer are located at positions facing the flexible display and each have a chamfered shape. According to the aspect of the invention, since the both end portions of the spacer have the chamfered shape, damage to the bent portion can be prevented.

DETAILED DESCRIPTION OF THE INVENTION

Figure 1:
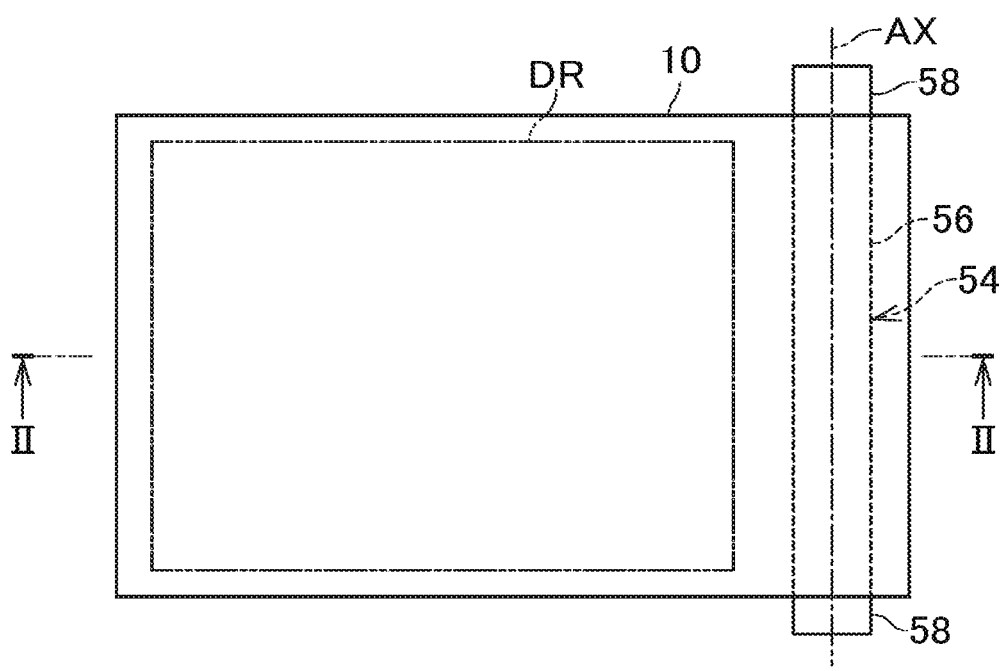
FIG. 1 is a plan view of a display device according to a first embodiment of the invention.

Hereinafter, embodiments of the invention will be described with reference to the drawings. However, the invention can be implemented in various aspects within the scope not departing from the gist of the invention, and should not be interpreted as being limited to the details described in the embodiments illustrated below.

For more clarity of description, the width, thickness, shape, and the like of each part may be schematically represented in the drawings, as compared with those in practicing aspects of the invention. However, they are illustrative only and do not limit the interpretation of the invention. In the specification and the drawings, elements having functions similar to those described in relation to a previous drawing are denoted by the same reference numerals and signs, and a repetitive description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

[First Embodiment]

FIG. 1 is a plan view of a display device according to a first embodiment of the invention. As the display device, an organic electroluminescent display device is exemplified. The display device is configured such that, for example, unit pixels (sub-pixels) of multiple colors of red, green, and blue are combined to form a full-color pixel (pixel), thereby displaying a full-color image.

Figure 2:
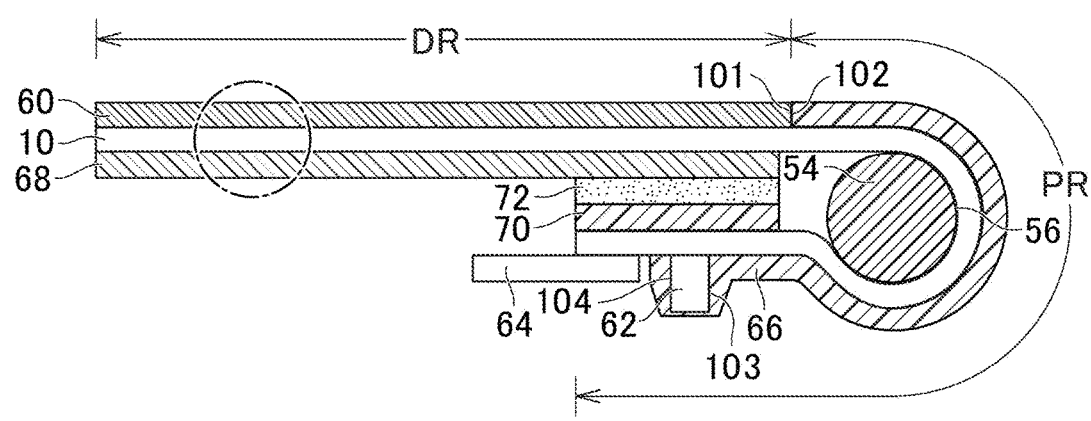
FIG. 2 is a cross-sectional view of the display device shown in FIG. 1, taken along line II-II.
Figure 3:
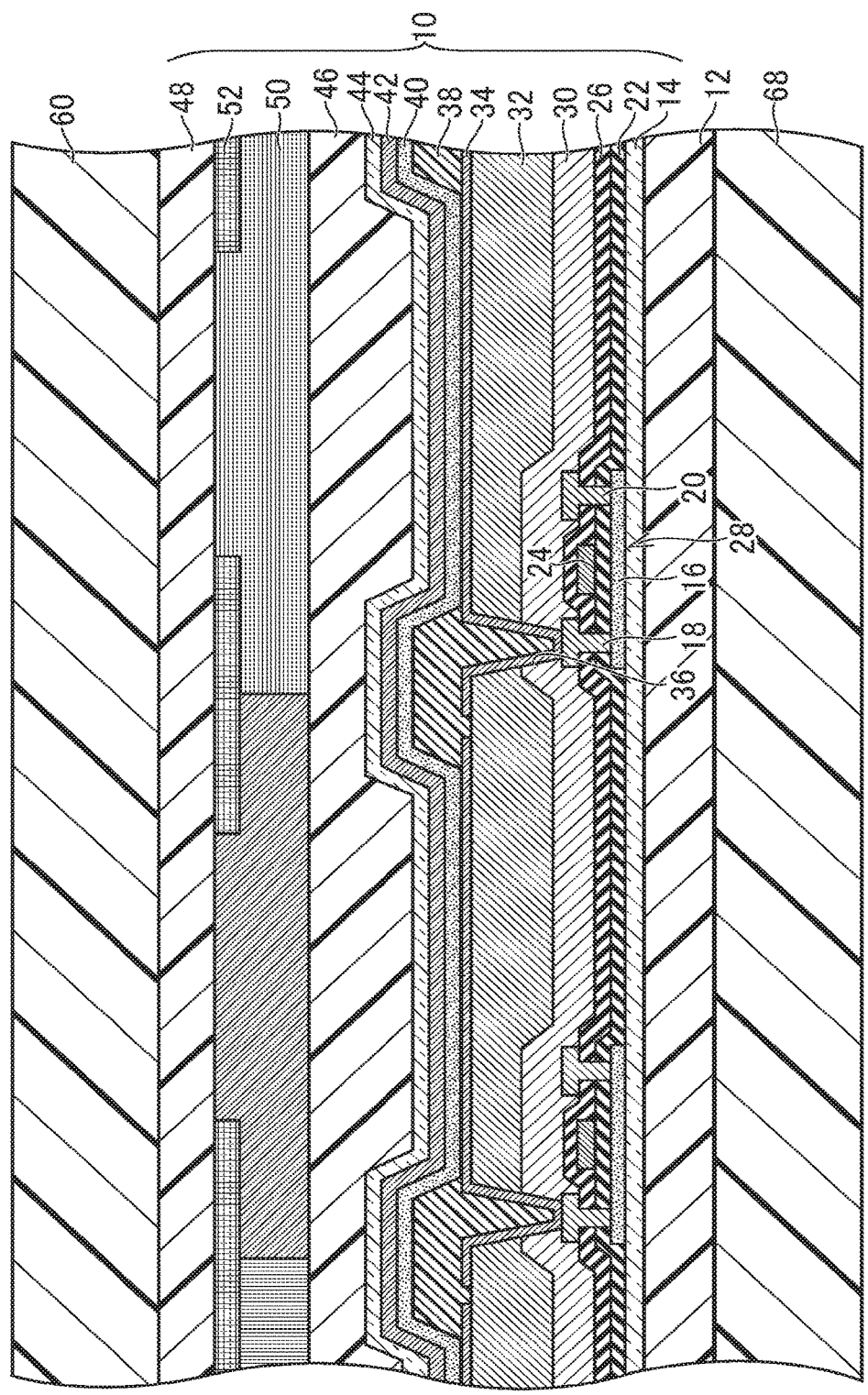
FIG. 3 is an enlarged view of the portion surrounded by the dash-dotted line in FIG. 2.

FIG. 2 is a cross-sectional view of the display device shown in FIG. 1, taken along line II-II. FIG. 3 is an enlarged view of the portion surrounded by the dash-dotted line in FIG. 2. The display device includes a flexible display 10. The flexible display 10 includes a first substrate 12 made of resin. An undercoat 14 serving as a barrier to an impurity contained in the first substrate 12 itself is formed on the first substrate 12, and a semiconductor layer 16 is formed on the undercoat 14. A source electrode 18 and a drain electrode 20 are provided on the semiconductor layer 16, and a gate insulating film 22 is formed to cover the semiconductor layer 16. A gate electrode 24 is formed on the gate insulating film 22, and an inter-layer insulating film 26 is formed to cover the gate electrode 24. The source electrode 18 and the drain electrode 20 penetrate the gate insulating film 22 and the inter-layer insulating film 26. The semiconductor layer 16, the source electrode 18, the drain electrode 20, and the gate electrode 24 constitute a thin film transistor 28. A passivation film 30 is provided so as to cover the thin film transistor 28.

A planarization layer 32 is provided on the passivation film 30. A plurality of pixel electrodes 34 (e.g., anodes) configured so as to correspond to a plurality of unit pixels are provided on the planarization layer 32. The planarization layer 32 is formed such that at least the surface on which the pixel electrode 34 is provided is flat. The pixel electrode 34 is electrically connected to one of the source electrode 18 and the drain electrode 20 on the semiconductor layer 16 through a contact hole 36 penetrating the planarization layer 32 and the passivation film 30.

An insulating layer 38 is formed on the planarization layer 32 and the pixel electrode 34. The insulating layer 38 is formed so as to lie on the peripheral edge of the pixel electrode 34 and open a portion (e.g., a central portion) of the pixel electrode 34. The insulating layer 38 forms a bank surrounding a portion of the pixel electrode 34.

A light-emitting element layer 40 is provided on the pixel electrodes 34. The light-emitting element layer 40 continuously lies on the plurality of pixel electrodes 34 and also lies on the insulating layer 38. As a modified example, the light-emitting element layer 40 may be provided individually (separately) for each of the pixel electrodes 34. The light-emitting element layer 40 includes at least a light-emitting layer, and may further include at least one layer of an electron transport layer, a hole transport layer, an electron injection layer, and a hole injection layer.

A common electrode 42 (e.g., a cathode) is provided on the light-emitting element layer 40 so as to be in contact with the light-emitting element layer 40 above the plurality of pixel electrodes 34. The common electrode 42 is formed so as to lie above the insulating layer 38 serving as a bank. The light-emitting element layer 40 is interposed between the pixel electrode 34 and the common electrode 42, and emits light with a luminance controlled by an electric current flowing therebetween.

The light-emitting element layer 40 is covered and thus sealed by a sealing layer 44 stacked on the common electrode 42, so that the light-emitting element layer 40 is shielded from moisture. A second substrate 48 is provided above the sealing layer 44 with a filling layer 46 therebetween. Colored layers 50 of multiple colors (e.g., blue, red, and green) are provided on the second substrate 48, and a black matrix 52 is formed of metal or resin between the colored layers 50 of different colors adjacent to each other, so that a color filter is configured. The second substrate 48 may be a touch panel, and may include a polarizer or a retardation film. A color image may be displayed in the form in which the colored layers 50 are absent and, instead, the light-emitting element layers 40 of the pixels emit the respective blue, red, and green lights.

As shown in FIG. 2, the flexible display 10 includes a display region DR and a peripheral region PR arranged in the length direction. The light-emitting element layer 40 is provided in the display region DR. The flexible display 10 is bent in the peripheral region PR around an axis AX (see FIG. 1) extending in the width direction orthogonal to the length direction.

A spacer 54 is disposed inside the bend of the flexible display 10. The spacer 54 includes a guide surface 56 that regulates the bend of the flexible display 10. The guide surface 56 is a curved surface corresponding to the radius of bend of the flexible display 10 to be bent. As shown in FIG. 1, the spacer 54 includes both end portions 58 on both sides in the width direction of the flexible display 10. The both end portions 58 of the spacer 54 project from the flexible display 10 in the width direction. According to the embodiment, since the both end portions 58 of the spacer 54 are not in contact with the flexible display 10, damage to the bent portion can be prevented.

The flexible display 10 is bent and folded back at the middle portion (a portion of the peripheral region PR) in the length direction, and at least the end portion of the peripheral region PR overlaps the display region DR. A portion of the peripheral region PR that overlaps the display region DR is flat without being bent. The display region DR is flat.

The front of the flexible display 10 on the side where an image is displayed is an outside surface that continues outside the bend, and the back on the side opposite to the front is an inside surface that continues inside the bend. In the display region DR, the light-emitting element layer 40 is provided on the outside surface.

A first front reinforcing film 60 is attached, on the outside surface, to at least the display region DR (only the display region DR or a region from the display region DR up to before the bent portion of the peripheral region PR) of the flexible display 10. The first front reinforcing film 60 is provided so as to cover the light-emitting element layer 40 (FIG. 3). An integrated circuit chip 62 is mounted, on the outside surface, in a position of the peripheral region PR that overlaps the display region DR, and a flexible board 64 is attached in the position. A second front reinforcing film 66 is attached to at least the bent portion of the peripheral region PR on the outside surface. The second front reinforcing film 66 may be provided so as to reach the portion of the peripheral region PR overlapping the display region DR, and cover the integrated circuit chip 62. The side end portion 101 of the first front reinforcing film 60 may be in contact with a first side end portion 102 of the second front reinforcing film 66. A second side end portion 103 of the second front reinforcing film 66 may be in contact with a side of the integrated circuit chip 62. A third side end portion 104 of the second front reinforcing film 66 may be in contact with another side of the integrated circuit chip 62.

A first back reinforcing film 68 is attached, on the inside surface, to at least the display region DR (only the display region DR or a region from the display region DR up to before the bent portion of the peripheral region PR) of the flexible display 10. The first back reinforcing film 68 is provided on the side opposite to the light-emitting element layer 40. In the peripheral region PR, a second back reinforcing film 70 is attached, on the inside surface, to a portion of the peripheral region PR that overlaps the display region DR, so as to face the first back reinforcing film 68. The first back reinforcing film 68 and the second back reinforcing film 70 are attached to each other via an adhesive 72, and thus the bent state of the flexible display 10 is maintained.

[Second Embodiment]

Figure 4:
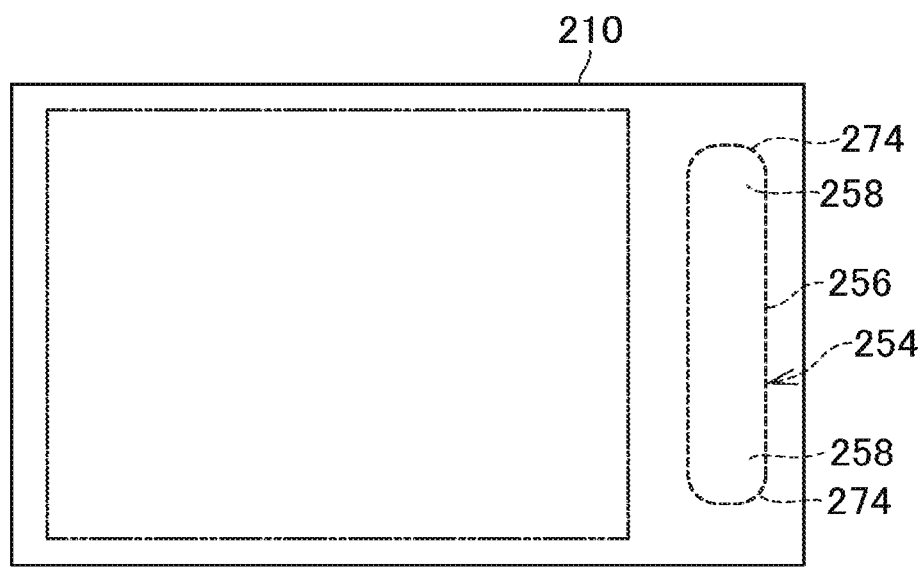
FIG. 4 is a plan view of a display device according to a second embodiment of the invention.

FIG. 4 is a plan view of a display device according to a second embodiment of the invention. In the embodiment, both end portions 258 of a spacer 254 are located at positions facing a flexible display 210, and each have a chamfered shape 274. The chamfered shape 274 is a shape that is connected to a guide surface 256 with a curved surface. According to the embodiment, since the both end portions 258 of the spacer 254 have the chamfered shape 274, damage to the bent portion can be prevented. The details described in the first embodiment apply to other details of the second embodiment.

[Third Embodiment]

Figure 5:
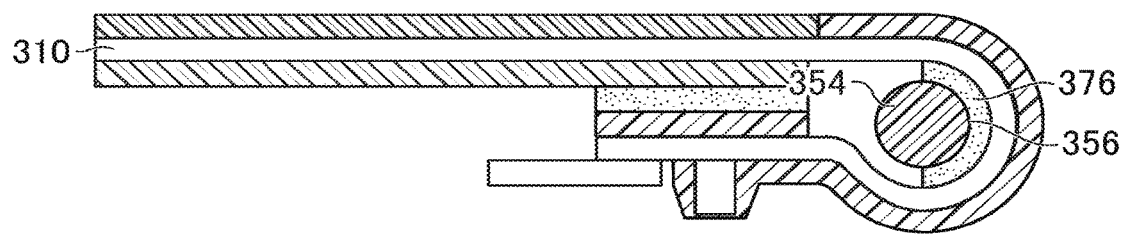
FIG. 5 is a cross-sectional view of a display device according to a third embodiment of the invention.

FIG. 5 is a cross-sectional view of a display device according to a third embodiment of the invention. In the embodiment, a gel 376 intervenes between a spacer 354 and a flexible display 310. The gel 376 is in contact with the flexible display 310 to regulate a bend. According to the embodiment, since the gel 376 softer than the spacer 354 intervenes between the spacer 354 (a guide surface 356) and the flexible display 310, damage to the bent portion of the flexible display 310 can be prevented. The details described in the first embodiment apply to other details of the third embodiment.

[Fourth Embodiment]

Figure 6:
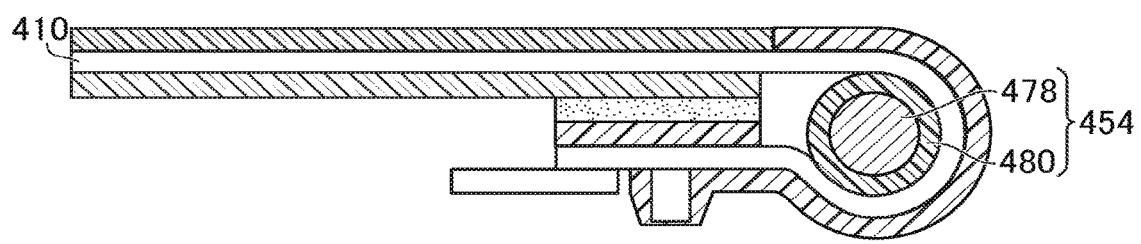
FIG. 6 is a cross-sectional view of a display device according to a fourth embodiment of the invention.

FIG. 6 is a cross-sectional view of a display device according to a fourth embodiment of the invention. In the embodiment, a spacer 454 includes a core layer 478 and a surface layer 480 made of a material softer than the core layer 478 and provided on the outer surface of the core layer 478. According to the embodiment, even when the core layer 478 is formed of a hard material such as metal, damage to the bent portion of a flexible display 410 can be prevented by the surface layer 480. The details described in the first embodiment apply to other details of the fourth embodiment.

The display device is not limited to an organic electroluminescent display device, but may be a display device including a light-emitting element such as a quantum-dot light-emitting element (quantum-dot light-emitting diode (QLED)) in each pixel or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a flexible display including a display region and a peripheral region arranged in a length direction, the flexible display being bent in the peripheral region around an axis extending in a width direction orthogonal to the length direction, the flexible display being provided with a light-emitting element layer in the display region; and
    a spacer disposed inside a bend of the flexible display and including both end portions on both sides in the width direction, the spacer including a guide surface regulating the bend,
    a first reinforcement film on the display region of the flexible display;
    a second reinforcement film on the peripheral region of the flexible display;
    a semiconductor circuit chip on the peripheral region; and
    a flexible board on the peripheral region, wherein
    the both end portions of the spacer project from the flexible display in the width direction,
    a side end portion of the first reinforcement film is in contact with a first side end portion of the second reinforcement film,
    a second side end portion of the second reinforcement film is in contact with one side of the semiconductor circuit chip,
    a third side end portion of the second reinforcement film is in contact with another side of the semiconductor circuit chip,
    the second reinforcement film is continuously formed from the first side end portion to the second side end portion, and
    the first reinforcement film, the first side end portion, the second side end portion, the semiconductor circuit chip, the third side end portion, and the flexible board are arranged in this order along a surface of the flexible display.

2. The display device according to claim 1, wherein the spacer includes a core layer and a surface layer made of a material softer than the core layer and provided on an outer surface of the core layer.

3. The display device according to claim 1, further comprising:
    a third reinforcement film being opposite to the first reinforcement film via the flexible display,
    a fourth reinforcement film being opposite to the semiconductor circuit chip via the flexible display, and
    an adhesive material adhering between the third reinforcement film and the fourth reinforcement film.

* * * * *